United States Patent
Tran

(10) Patent No.: US 6,473,702 B1
(45) Date of Patent: Oct. 29, 2002

(54) SYSTEM AND METHOD FOR INTEGRATED SINGULATION AND INSPECTION OF SEMICONDUCTOR DEVICES

(75) Inventor: Dean Tran, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 151 days.

(21) Appl. No.: 09/604,163

(22) Filed: Jun. 27, 2000

(51) Int. Cl.⁷ .............................................. H01L 21/44
(52) U.S. Cl. ......................................... 702/81; 438/130
(58) Field of Search ............................... 702/81; 257/46, 257/529, 530; 438/125, 130, 109, 14, 15; 365/94, 96, 225.7; 29/840, 843, 855; 359/811

(56) References Cited

U.S. PATENT DOCUMENTS 4,763,409 A  *  8/1988  Takekawa et al. ......... 174/52.1
5,691,650 A  *  11/1997  Sugai ........................ 324/755
6,194,738 B1 *  2/2001  Debenham et al. ........... 257/48
6,228,687 B1 *  5/2001  Akram et al. ............... 438/108

* cited by examiner

Primary Examiner—Kamini Shah

(57) ABSTRACT

A method and system for an integrated singulation process for electrically testing semiconductor devices in a strip, singulating the semiconductor devices and inspecting the semiconductor devices. An electrical tester marks a code on the semiconductor devices indicating whether each semiconductor device passed an electrical test. An optical code reader reads the code and stores the test results in memory. A singulation machine singulates the semiconductor devices into individual semiconductor devices and a sorter discards the semiconductor devices which failed the electrical tests. An inspection machine inspects the dimensions of each semiconductor device and a sorter discards the semiconductor devices which failed the inspection. The inspection machine outputs the semiconductor devices which passed both the electrical test and inspection.

14 Claims, 3 Drawing Sheets

SYSTEM AND METHOD FOR INTEGRATED SINGULATION AND INSPECTION OF SEMICONDUCTOR DEVICES

FIELD OF THE INVENTION

The present invention relates to an integrated singulation system and method for singulation and inspection of semiconductor devices. The present invention has particular applicability in the automated process of singulation and inspection of semiconductor devices in which only the semiconductor devices which passed an electrical test are inspected.

BACKGROUND ART

Semiconductor devices, such as integrated circuit (IC) chips are manufactured in strips. During the manufacturing process, each semiconductor device in the strip of semiconductor devices is electrically tested, cut into individual semiconductor devices in a singulation process and inspected. The electrical test determines if the semiconductor device is operating according to electrical specifications for the semiconductor device. The inspection also determines whether the semiconductor is within the proper physical dimensions for the semiconductor device. If a semiconductor device fails either test, then the semiconductor device is discarded. Conventional testing of semiconductor devices is a time-consuming process.

In conventional testing systems, a strip of semiconductor devices would be electrically tested, each semiconductor device being tested individually. However, "strip testing" is becoming more popular. In strip testing, a group of semiconductor devices are tested at the same time. Currently, 16 or 32 semiconductor devices can be tested at the same time. Therefore, strip testing has greatly reduced the testing time required to test the semiconductor devices.

Although strip testing has reduced the testing time, each semiconductor device is inspected regardless of whether the semiconductor device failed the electrical test. Since the inspection of each semiconductor device for physical dimension conformance is still performed one at a time, the inspection of a semiconductor device that is destined to be discarded for failing the electrical test is unnecessary. Therefore, it would be advantageous to discard semiconductor devices which fail the electrical test and do not need to be inspected.

There exists a need for an integrated singulation and inspection process for semiconductor devices, thereby reducing the inspection time and increasing production throughput.

SUMMARY OF THE INVENTION

These and other needs are met by embodiments of the present invention which provide a method and system for only inspecting semiconductor devices which have passed an electrical test and discarding the semiconductor devices which failed the electrical test.

The integrated singulation machine of the present invention includes a memory storing test results indicating whether a plurality of singulated semiconductor devices passed an electrical test, a processor for reading the test results stored in memory and a sorter, controlled by the processor, for sorting the semiconductor devices and discarding singulated semiconductor devices which failed the electrical test. The integrated singulation machine saves time by discarding semiconductor devices which failed the electrical test rather than unnecessarily inspecting the singulated semiconductor devices to ensure that they are within the proper physical dimensions.

The integrated singulation system of the present invention an optical code reader for reading a code marked on a semiconductor device which is part of a strip of semiconductors, wherein the code indicates the test result of whether the individual semiconductor device passed an electrical test and a singulation machine. The singulation machine cuts the strip of semiconductor devices into individual semiconductor devices and further comprises a memory for storing the result of the electrical test for each semiconductor device, a processor for reading the test results stored in memory and a sorter, controlled by the processor, for sorting the semiconductor devices and discarding the semiconductor devices which failed the electrical test. The optical code reader assists in determining whether to automatically discard the semiconductor devices by reading the test results which indicate whether the semiconductor devices passed the electrical test.

The method of the present invention is for inspecting semiconductor devices. The method comprises the steps of reading a code on a semiconductor device in a strip of semiconductor devices, wherein the code indicates whether the semiconductor device passed an electrical test, singulating the strip of semiconductor devices into individual semiconductor devices and automatically discarding the semiconductor devices in which the code indicates that the semiconductor device failed the electrical test, in response to reading of the code on the semiconductor device. Automatically discarding the semiconductor devices that failed the electrical test, ensures that time is not wasted inspecting the physical dimensions of the semiconductor devices.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Conventional methods and systems for inspecting semiconductor devices are ineffective, time-consuming and expensive. Conventional systems inspect the physical dimensions of a semiconductor device regardless of whether the semiconductor device failed an electrical test and therefore will be discarded for failing the electrical test. The present invention addresses and solves these problems associated with the conventional testing of semiconductor devices.

Figure 1:
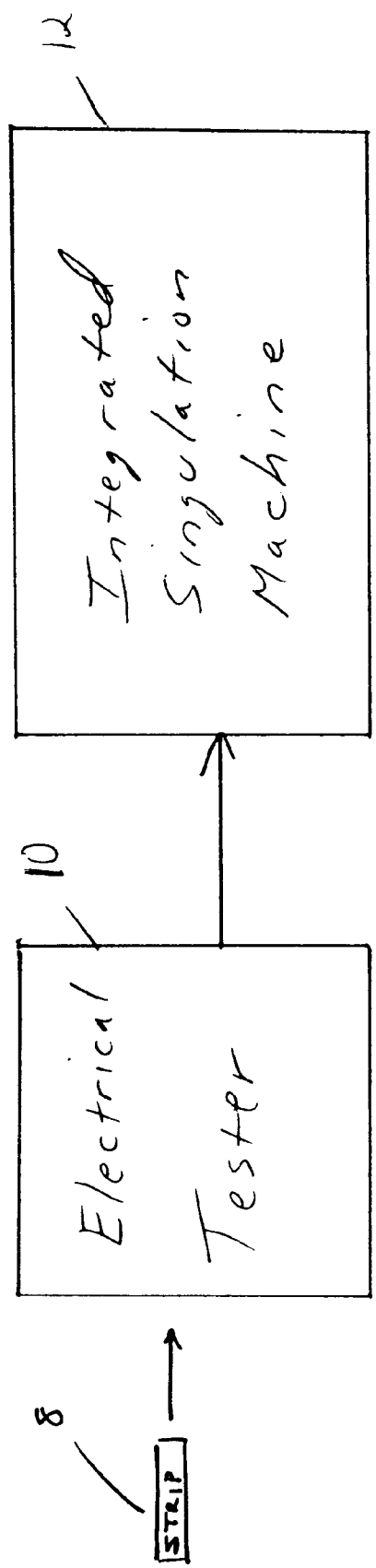
FIG. 1 is a block diagram of an electrical tester and an integrated singulation system in accordance with an embodiment of the present invention.

Referring to FIG. 1, a block diagram of an electrical tester and an integrated singulation system in accordance with an embodiment of the present invention is illustrated. As shown, an electrical tester 10 strip tests a strip 8 of semiconductor devices. The strip test electrically tests a group of semiconductor devices to determine whether each semiconductor device in the strip operates according to the specifications for the semiconductor device. In an alternate embodiment, the electrical tester 10 tests each semiconductor device one at a time. After performing the electrical test, the electrical tester 10 then laser marks the strip of semiconductor devices using a laser. Typically, the mark or code is simply a single bit, e.g., a one for passing the test and a zero for failing the test. In an alternate embodiment, the entire strip can be marked with one code where the each bit of the code represents a corresponding semiconductor device. In yet another embodiment, the individual semiconductor devices are marked in manners known in the art. The marked strip 8 of semiconductor devices is passed to the integrated singulation system 12.

Figure 2:
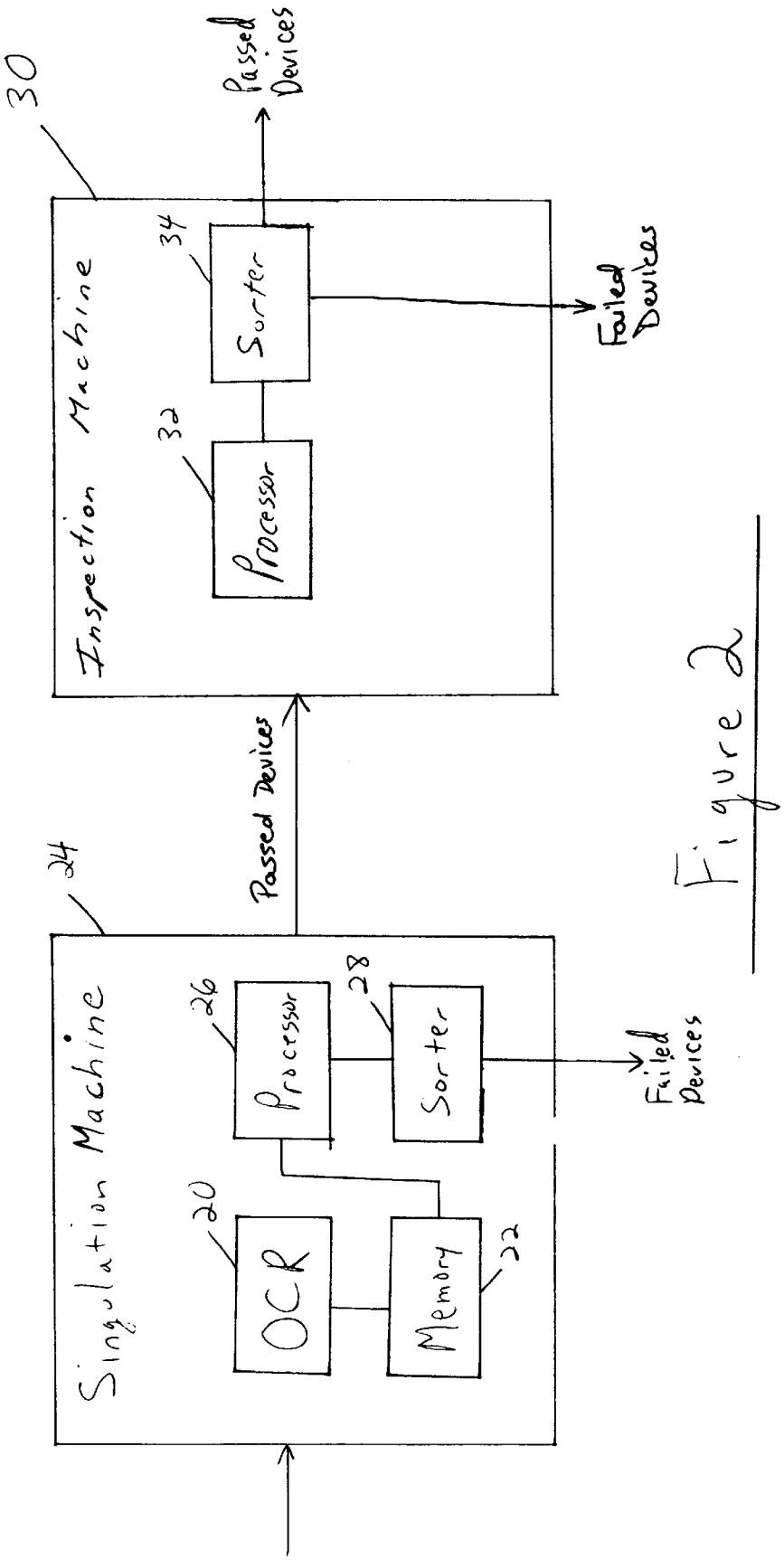
FIG. 2 is a block diagram of the integrated singulation system in accordance with an embodiment of the present invention.

Referring to FIG. 2, a block diagram of the integrated singulation system in accordance with an embodiment of the present invention is illustrated. As shown, an optical code reader (OCR) 20 in a singulation machine 24 reads the code marked on the strip 8 of semiconductor devices and stores the test results in memory 22. In an alternate embodiment the OCR 20 is a stand alone component which is coupled between the electrical tester 10 and the singulation machine 24.

The singulation machine 24 cuts or singulates the strip 8 of semiconductor devices into individual semiconductor devices. A processor 26 in the singulation machine 24 reads the test results from memory 22 and controls a first sorter 28 which sorts the individual semiconductor devices into two groups based on the test result for each semiconductor device. One group consists of the semiconductor devices that passed the electrical test and the other group consists of the semiconductor devices that failed the electrical test. The group of semiconductor devices that failed the electrical test are discarded. In an alternate embodiment, the first sorter 28 is coupled to the singulation machine 24 and contains a processor which controls the first sorter 28.

An inspection machine 30 inspects only the group of semiconductor devices that passed the electrical tests. The inspection machine 30 inspects the dimensions of a semiconductor device to ensure that the dimensions of the semiconductor device are within the tolerances for the given semiconductor device. A processor 32 in the inspection machine 30 controls a second sorter 34 which sorts the individual semiconductor devices into two groups. One group consists of the semiconductor devices that passed the inspection and the other group consists of the semiconductor devices that failed the inspection. The group of semiconductor devices that passed both the electrical test and inspection are outputted. The group of semiconductor devices that failed the inspection are discarded.

Figure 3:
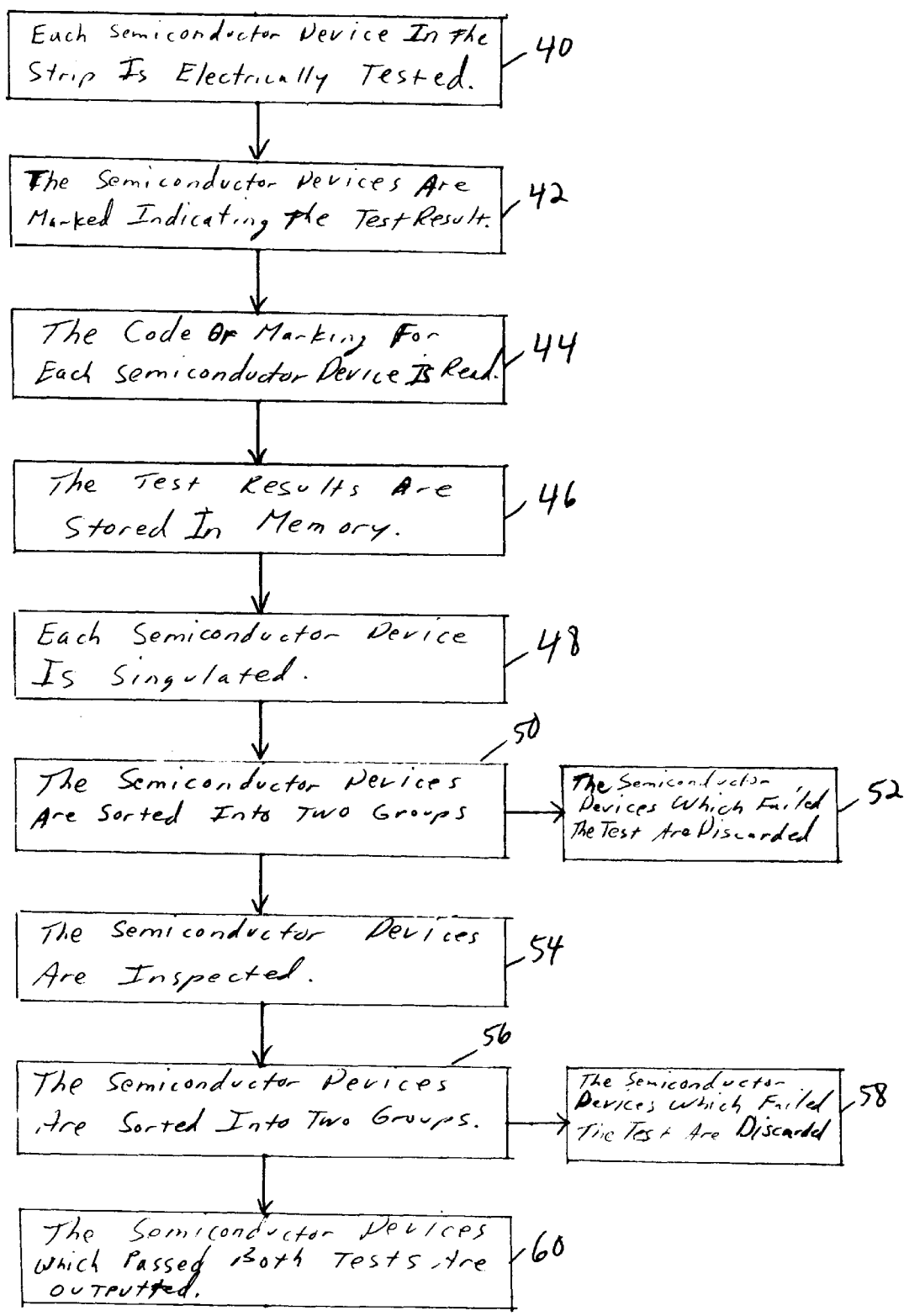
FIG. 3 a flow chart of the steps of the electrical test and inspection process of testing semiconductor devices in accordance with an embodiment of the present invention.

Referring to FIG. 3, a flow chart of the steps of the electrical test and inspection process of testing semiconductor devices in accordance with an embodiment of the present invention is illustrated. As shown, the process starts with the strip of semiconductor devices being electrical tested at step 40. In the preferred embodiment, the strip of semiconductors is strip tested. Typically, the strip of semiconductor devices consists of 80 semiconductor devices with the electrical tester 12 strip testing a group of 16 or 32 semiconductor devices at a time. In alternate embodiments, each semiconductor device in the strip is tested one at a time.

The semiconductor devices are marked indicating whether the semiconductor device passed or failed the electrical test at step 42. The marking or code for a semiconductor device is read at step 44. The test results are stored in memory at step 46. The semiconductor devices are cut or singulated into individual semiconductor devices by a singulation machine at step 48. A first sorter sorts the semiconductor devices into two groups based on the test results stored in memory at step 50. One group consists of the semiconductor devices that passed the electrical test and the other group consists of the semiconductor devices that failed the electrical test. The group of semiconductor devices that failed the electrical test are discarded at step 52.

The group that contains the semiconductor devices that passed the electrical test are inspected by the inspection machine to ensure that the dimensions of the semiconductor device are within the tolerances for the given semiconductor device at step 54. A second sorter sorts the semiconductor devices into two groups based on the inspection at step 56. One group consists of the semiconductor devices that passed the inspection and the other group consists of the semiconductor devices that failed the inspection. The group consisting of the semiconductor devices that failed the inspection test are discarded at step 58. The group of semiconductor devices that passed both the electrical and the inspection are outputted at step 60.

Conventional machine vision sorters and handlers may be readily employed in the present invention, provided they are configured to operate in accordance with the invention, which is within the skill of one of ordinary skill in the art provided with the above details of the present invention.

The present invention provides a method and an integrated singulation process that discards semiconductor devices which failed an electrical test prior to inspecting the semiconductor devices to ensure that the dimensions of the semiconductor device are within tolerances for the semiconductor device. As a result, the process of inspecting the semiconductor devices is more efficient since the inspection machine only inspects semiconductor devices which have passed an electrical test.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. An integrated singulation machine comprising:
 a memory storing test results indicating whether a plurality of singulated semiconductor devices passed an electrical test;
 a processor for reading the test results stored in memory; and
 a sorter for sorting the semiconductor devices and discarding singulated semiconductor devices which failed the electrical test, wherein the sorter is controlled by the processor.

2. The integrated singulation machine of claim 1, wherein the integrated singulation machine singulates the strip of semiconductor devices into singulated semiconductor devices.

3. The integrated singulation machine of claim 1, further comprising an optical code reader for reading a code marked on a semiconductor device which is part of a strip of semiconductors and storing the test results in the memory, wherein the code indicates the test result of whether the individual semiconductor device passed an electrical test.

4. An integrated singulation system comprising:
 an optical code reader for reading a code marked on a semiconductor device which is part of a strip of semiconductors, wherein the code indicates the test result of whether the individual semiconductor device passed an electrical test; and
 a singulation machine for cutting the strip of semiconductor devices into individual semiconductor devices and further comprising:
  a memory for storing the result of the electrical test for each semiconductor device;
  a processor for reading the test results stored in memory; and
  a sorter for sorting the semiconductor devices and discarding the semiconductor devices which failed the electrical test, wherein the sorter is controlled by the processor.

5. The system of claim 4, further comprising an inspection machine for inspecting the dimensions of each semiconductor device that passed the electrical test.

6. The system of claim 5, wherein the inspection machine further comprises a processor for controlling a sorter for discarding the semiconductor devices which failed the inspection test.

7. The system of claim 4, further comprising a tester for electrically testing the semiconductor devices in the strip of semiconductor devices.

8. The system of claim 7, wherein the tester electrically tests the semiconductor devices in the strip of semiconductor devices one at a time.

9. The system of claim 7, wherein the tester electrically strip tests a plurality of the semiconductor devices in the strip of semiconductor devices at the same time.

10. The system of claim 7, further comprising a laser for marking the semiconductor devices with a code indicating whether the semiconductor devices passed the electrical test.

11. A method for inspecting semiconductor devices, comprising the steps of:
 electrically testing each semiconductor device in a strip of semiconductor devices;
 marking a code on each semiconductor device indicating the result of the electrical test;
 optically reading the code on said each semiconductor device in the strip of semiconductor devices;
 storing each code in a memory after the code has been read
 singulating the strip of semiconductor devices into individual semiconductor devices; and
 automatically discarding the semiconductor devices in which the code indicates that the semiconductor device failed the electrical test, in response to reading of the code on the semiconductor device.

12. The method of claim 11, further comprising reading the code stored in memory and using the test result to determine whether to discard the semiconductor.

13. The method of claim 11, further comprising inspecting the dimensions of a semiconductor device which passed the electrically test.

14. The method of claim 13, further comprising automatically discarding the semiconductor devices which failed the inspection.

* * * * *